(12) United States Patent
Pruessmann et al.

(10) Patent No.: US 7,342,397 B2
(45) Date of Patent: Mar. 11, 2008

(54) MAGNETIC RESONANCE IMAGING METHOD

(75) Inventors: Klaas Pruessmann, Zürich (CH); Jeffrey Tsao, Brookline, MA (US)

(73) Assignee: Universitat Zurich and ETH Zürich, Zürich (CH)

( * ) Notice: Subject to any disclaimer, the term of this patent is extended or adjusted under 35 U.S.C. 154(b) by 0 days.

(21) Appl. No.: 10/563,178

(22) PCT Filed: Jun. 24, 2004

(86) PCT No.: PCT/CH2004/000386

§ 371 (c)(1),
(2), (4) Date: Apr. 25, 2006

(87) PCT Pub. No.: WO2005/003803

PCT Pub. Date: Jan. 13, 2005

(65) Prior Publication Data

US 2006/0186941 A1    Aug. 24, 2006

(30) Foreign Application Priority Data

Jul. 3, 2003    (EP)    ................... 03015094

(51) Int. Cl.
*G01V 3/00* (2006.01)
(52) U.S. Cl. .................................. 324/307
(58) Field of Classification Search ........ 324/300–322; 600/410–435; 382/128–134, 276–280, 320; 702/19–32, 106, 189–199
See application file for complete search history.

(56) References Cited

U.S. PATENT DOCUMENTS 6,289,232 B1 * 9/2001 Jakob et al. ................ 600/410

OTHER PUBLICATIONS

J. Tsao et al. "Minimum-norm Reconstruction for Optimal Spatial Response in High-Resolution SENSE Imaging" Proc. Intl. Soc. Mag. Reson. Med. 11 (2003), p. 14, XP-002296625.
K. Pruessmann et al. "SENSE: Sensitivity Encoding for Fast MRI" Magnetic Resonance in Medicine 42:952-962 (1999), pp. 952-962, XP-000866655.
U. Dydak et al. "The Spatial Response Function in SENSE-SI" Proc. Intl. Soc. Mag. Reson. Med. 8 (2000), p. 1848, XP-002296626.
J. Tsao et al. "Feedback Regularization for SENSE Reconstruction" Proc. Intl. Soc. Mag. Reson. Med. 10 (2002), XP-002296627.
X. Zhao et al. "Recursive SENSE for Reducing Artifacts in Sensitivity-Encoded Spectroscopic Imaging" Proc. Intl. Soc. Mag. Reson. Med. 10 (2002), XP-002296628.
U. Katscher et al. "Underdetermined SENSE Using a-priori Knowledge" Proc. Intl. Soc. Mag. Reson. Med. 10 (2002), XP-002297147.
International Preliminary Report On Patentability dated Jan. 3, 2006 for International Application No. PCT/CH2004/000386 filed Jun. 24, 2004 (8 pages).
Written Opinion of the International Searching Authority for International Application No. PCT/CH2004/000386 filed Jun. 24, 2004 (7 pages).

* cited by examiner

*Primary Examiner*—Brij Shrivastav
*Assistant Examiner*—Dixomara Vargas
(74) *Attorney, Agent, or Firm*—McCormick, Paulding & Huber LLP (57) ABSTRACT

A novel magnetic resonance imaging method is described, wherein undersampled magnetic resonance signals are acquired by a receiver antenna system having spatial sensitivity profiles and the image being reconstructed from the undersampled magnetic resonance signals and the spatial sensitivity profiles. The reconstruction of the image is provided by an optimization of a cost function which accounts for any of noise statistics, signal statistics, and the spatial response function, the latter of which is defined by the spatial signal response from the object to be imaged, separately for each individual pixel.

18 Claims, 3 Drawing Sheets

MAGNETIC RESONANCE IMAGING METHOD

The present invention relates to a magnetic resonance imaging method wherein undersampled magnetic resonance signals are acquired by a receiver antenna system having spatial sensitivity profiles according to the preamble portion of claim 1. The invention is further directed to a magnetic resonance apparatus and a computer program product for executing the magnetic resonance method.

Such a magnetic resonance imaging method is usually indicated as a parallel imaging method and known from the paper by K. Pruessmann et. al. in Magn. Reson. Med. 42 (1999), pages 952-962 and indicated as SENSE. Parallel imaging (PI) techniques exploit the spatial encoding effect inherent to inhomogeneous receiver sensitivity. Using arrays of multiple receiver coils, parallel acquisition permits reducing the k-space sampling density, thus enabling significant scan-time reduction. PI reconstruction according to the SENSE method is typically performed by image domain unfolding, which enables very fast processing in the common case of Cartesian k-space sampling (Cartesian SENSE). The efficiency of this approach stems from the underlying assumption that the coil sensitivities do not change significantly across each voxel. While well fulfilled at high resolution, this assumption is gradually violated at low resolution, such as in spectroscopic imaging (SI). As a consequence, the spatial response function (SRF) in conventional SENSE spectroscopic imaging is prone to imperfections, which typically result in residual aliasing artifacts.

To resolve the aliasing, Cartesian SENSE reconstructs each set of aliased voxels separately, thus decomposing the reconstruction into a series of smaller independent problems, which can be solved quickly. However, with this decomposition, the aliasing is only resolved exactly at the voxel centers. Residual aliasing artifacts occur when the sensitivity near a coil rises at a faster rate than the decay of the sinc function. These artifacts are accentuated if k-space is partially zero-filled. Thus, residual artifacts can arise in high-resolution MRI, even with 50% zerofilling in k-space, which is often used in 3D applications.

This problem was previously addressed by sensitivity extrapolation (see. U. Dydak et. al., Magn. Reson. Med. 2001; 46: p.713-722) and by the transition to modified, effective sensitivity values in a recursive scheme (see X. Zhao et. al., Proc. ISMRM 2002, Abstract No. 2393)

It is an object of the present invention to eliminate in the above mentioned parallel imaging method the residual aliasing artifacts arising from high resolution images reconstructed with parallel imaging techniques. It is a further object of the invention to provide a magnetic resonance imaging system and a computer program product adapted to such a method.

This object is solved by the method as claimed in claim 1. The further objects are achieved by the magnetic resonance imaging system according to claim 14 and the computer program product according to claim 15.

The gist of the present invention is that residual aliasing artifacts can be eliminated by the minimum-norm least-squares reconstruction, which is consistent with the "strong" reconstruction as described in the above mentioned article of K. P. Prüssmann et. al.

Further advantages of the invention are disclosed in the dependent claims and in the following description in which an exemplified embodiment of the invention is described with respect to the accompanying drawings. It shows FIG. 1 an aliased image and the spatial response function of the marked pixel in the image, FIG. 2 a minimum-norm reconstruction at different iterations of the conjugate gradient algorithm, FIG. 3 the panels of a zoomed portion of the reconstructions, FIG. 4 SRF with minimum norm and conventional reconstruction, FIG. 5 phantom, conventional and minimum-norm reconstruction, and FIG. 6 diagrammatically a magnetic resonance imaging system

GENERAL PRINCIPLES OF THE INVENTION

Consider a general MR imaging experiment during which $N_\mu$ complex data samples are acquired. Each measured signal value $m_\mu$ represents the spatial integral of an object-specific signal density function $d(r)$, modulated by an encoding function $e_\mu(r)$:

$$m_\mu = \int d(r) e_\mu(r) dr + \eta_\mu \quad [1]$$

where $\mu \in \{1, 2, \ldots, N_\mu\}$, and $\eta_\mu$ denotes the complex noise component acquired along with the resonance signal. Noise in MRI is typically of thermal original, stemming from within the object as well as from the detector circuitry.

The encoding functions can reflect any modulation that the object's magnetization undergoes in the course of the experiment. Typical means of spatial encoding are plane-wave modulation by linear gradient fields, sensitivity encoding by one or multiple receiver coils, or RF encoding by RF pulses. The encoding functions can also account for undesired effects, such as phase errors due to main field inhomogeneity. Incorporating only gradient and sensitivity encoding, for instance, the encoding functions read $$e_\mu(r) = e^{-ik_\mu r} s_\mu(r) \quad [2]$$

where $k_\mu$ denotes the position in k-space at which the value $m_\mu$ is taken and $s_\mu(r)$ denotes the complex spatial sensitivity of the receiver coil with which it is taken.

Reconstructing an image from the acquired data amounts to calculating the values of the image components, which are typically called pixels. Let the index $\pi 0$ count the pixel values $p_\pi$ in the desired resulting image, with $N_\pi$ denoting their total number. Typically, the calculation of the pixel values is assumed to be linear, reflecting the linearity of the integral in Eq. [1] with respect to $d(r)$. Then image reconstruction can be written as $$p = Fm \quad [3]$$

where the pixel values and the measured data were assembled in the vectors p and m, respectively, which are connected through the reconstruction matrix F with $N_\pi$ rows and $N_\mu$ columns.

The problem of image reconstruction is thus recast as the problem of choosing the entries of the matrix F. The main goal in the choice of F is to ensure the proper depiction of the object, i.e. to make each pixel value reflect signal that originates from a corresponding small volume (voxel) in real space. In order to track the spatial weighting of MR signal in the pixel value $p_\pi$ one can insert Eq. [1] into Eq. [3] and extract the corresponding row:

$$p_\pi = \int d(r)\left(\sum_\mu F_{\pi,\mu}e_\mu(r)\right)dr + \sum_\mu F_{\pi,\mu}\eta_\mu \quad [4]$$

Here the expression in brackets reflects the spatial weighting of MR signal in the pixel value and is thus called the spatial response function (SRF) of the pixel:

$$SRF_\pi(r) = \sum_\mu F_{\pi,\mu}e_\mu(r) \quad [5]$$

Each pixel in the final image has an individual SRF. In order to make a pixel represent resonance signal from the corresponding voxel, its SRF should ideally be non-zero inside the voxel and zero outside the voxel. However, such ideal SRFs can usually not be accomplished, as they must be linear combinations of the encoding functions (see Eq. [5]). Therefore, SRFs in MRI are generally imperfect in that they exhibit smooth rather than sharp transitions at the voxel borders and are not exactly zero outside the voxel. In the resulting image, these defects are perceived as artifacts (e.g. blurring or aliasing), which limit the image's usefulness, e.g., its diagnostic value.

In response to this problem, it is one object of the present invention to optimize the SRF, either globally or on a pixel by pixel basis. For this purpose, the SRF is preferably discretised by sampling the encoding functions along a finite set of positions in 3D space. Let this set be given by $$r_\rho, \text{ where } \rho \in \{1, 2, \ldots, N_\rho\} \quad [6]$$

Typically this set would form a regular Cartesian grid, yet it does not need to. The discretisation may as well be performed along any finite set of positions, e.g., along hexagonal or radial grids. Sampling the encoding functions at $r_\rho$ yields the encoding matrix $$E_{\mu,\rho} = e_\mu(r_\rho) \quad [7]$$

which has $N_\mu$ rows and $N_\rho$ columns. Using this notion, the discretised SRF of the pixel $\pi$ is given by the $\pi$-th row of the SRF matrix $$SRF_{discrete} = FE \quad [8]$$

More generally, each row of this matrix represents the discretised SRF of the corresponding voxel. Note that this representation can be taken to any level of accuracy by enhancing the number and density of the sampling positions $r_\rho$.

For SRF optimisation, the entries of F are chosen such that the individual SRFs approach given idealised target shapes. It depends on the application which SRF shape is considered ideal. In terms of overall depiction fidelity, Dirac distributions or boxcar functions may be regarded as optimal. For the purpose of suppressing far-range signal contamination, Gaussian shapes may be superior or potential prior knowledge about the resonance signal distribution in the object may favour other, tailored shapes. Any target SRF shape can be accommodated within the formalism explained here. Moreover, each pixel can be assigned an individual target SRF shape. This is done by a target SRF matrix T, whose $\pi$-th row is the discrete representation of the SRF considered ideal for the pixel with index $\pi$:

$$T_{\pi,\rho} = SRF_\pi^{Target}(r_\rho) \quad [9]$$

The difference between the target SRFs and those actually achieved is hence reflected by $SRF_{discrete} - T$. For pixel-by-pixel SRF optimization, this difference is minimized row by row. In order to do so, the magnitude of each row of $SRF_{discrete} - T$ is typically expressed using a vector norm along with a general linear mapping preceding the norm operation. The SRF deviation for the pixel $\pi$ is then $$\Delta_\pi = \|((FE-T)A)_\pi\| \quad [10]$$

where A is a matrix representing a suitable linear mapping, the subscript $\pi$ on the right side indicates the $\pi$-th row vector of the matrix product in brackets, and $\|\cdot\|$ denotes the chosen vector norm. In principle, any norm can be used, including the sum, maximum, and Euclidean norms. The Euclidean norm $\|\cdot\|_2$ is preferable as it leads to particularly feasible calculations. The SRF deviation is then quantified as $$\Delta_\pi = \|((FE-T)A)_\pi\|_2 = \sqrt{((FE-T)\theta(FE-T)^H)_{\pi,\pi}} \quad [11]$$

where $\theta = AA^H$ and the superscript H indicates the Hermitean adjoint, i.e. the complex conjugate transpose.

Minimizing $\Delta_\pi$ independently for each $\pi$ using common means of linear algebra yields the reconstruction matrix $$F = T\theta E^H(E\theta E^H)^+ \quad [12]$$

where the superscript + indicates the Moore-Penrose pseudoinverse.

Reconstruction according to Eqs. [3, 12] yields optimal SRFs. One problem that may occur in applying this formula is ill-conditioning of the matrix F. Ill-conditioning leads to enhancement of the noise component in Eq. [4] (second term on right hand side of Eq. [4]), which frequently reaches unacceptable levels. Therefore, another object of this invention is to control noise enhancement in addition to SRF quality. According to another paper by K P Pruessmann et al. (Magn Reson Med 2001;46:638-651), the noise level in the pixel value $\pi$ is given by $$\Lambda_\pi = \sqrt{(F\Psi F^H)_{\pi,\pi}} \quad [13]$$

where $\Psi$ denotes the noise covariance matrix of the acquired data. The properties of this matrix and the means of determining it are described in the above mentioned paper by K P Pruessmann et al.

Using these notions, the task of ensuring proper image quality is restated as choosing F such that both $\Lambda_\pi$ and $\Delta_\pi$ are close to minimal for each pixel $\pi$. This can, for instance, be accomplished by minimizing the weighted sum of squares of the two terms:

$$\min(\alpha\Lambda_\pi^2 + \beta\Delta_\pi^2) \quad [14]$$

where $\alpha$ and $\beta$ are scalar, real-valued, non-negative weighting coefficients. Performing this minimization using common means of linear algebra yields the reconstruction matrix $$F = \beta T\theta E^H(\beta E\theta E^H + \alpha\Psi)^+ \quad [15]$$

For $\alpha \neq 0$ and $\beta \neq 0$, an equivalent formula is given by $$F = \alpha^{-1}T(\alpha^{-1}E^H\Psi^+E + \beta^{-1}\theta^+)^+E^H\Psi^+ \quad [16]$$

The equations [3, 15, 16] determine image reconstruction that controls SRF quality and noise simultaneously, individually for each pixel. To use these formulae, several choices must be made, which are listed and described in the following:

1. Format of the Desired Image

The format of the desired image must be chosen, i.e. the number of pixels in the desired image, $N_\pi$, as well as the target shape of their corresponding SRFs, $SRF_\pi^{Target}(r)$. Note that by specifying the target SRF shape for the pixel π, one also specifies the position of the SRF's main lobe. This position will typically correspond to the placement of the pixel in the image space. The main lobe will then shift according to the pixel position. Even if the same underlying shape is chosen for all pixels, the target SRFs will differ by this shift. Note, however, that the target SRFs may also vary from pixel to pixel in terms of the underlying shape. Note also that the spatial arrangement of the target SRFs does not need to be regular, e.g., such that the main lobe positions form a Cartesian grid. Each pixel's target SRF shape may be chosen fully independently, e.g., such that main lobes form a hexagonal or radial pattern.

In a typical embodiment, the target SRFs would be sharply localized functions, e.g. Dirac, boxcar, Gaussian, Lorentzian, or Sinc shapes, with their centers arranged along a Cartesian grid. Preferably, the distance between neighbouring target SRF centers is chosen to be less than the smallest features of the encoding functions. With larger distances between SRF centers, the resolution of the final image will be suboptimal.

Typically, the same target SRF shape is chosen for each pixel, with individual shifts corresponding to the pixel position. This has the advantage that left-multiplication by the matrix T, as required by Eqs. [15, 16], reduces to a convolution, which can be performed very efficiently using fast Fourier transform (FFT).

Especially efficient calculations result from choosing the target SRFs to be Dirac shapes, with their center positions identical to the set of positions $r_\rho$ used for discretisation. In this case, the matrix T is an identity matrix (see Eq. [9]) and can thus be omitted.

2. Discretisation

The specific form of the discretisation must be chosen. This is done by specifying the total number of sampling positions, $N_\rho$, and the positions themselves, $r_\rho$. Note that these positions generally lie in 3D space. Typically, they should cover the object to be examined with sufficient density so that the relevant features of the resulting SRFs are captured in the SRF matrix according to Eq. [8]. It is imperative that the discretisation be sufficiently fine. In the common situation where Fourier encoding with gradient fields is the dominant encoding mechanism, the maximum distance between neighbouring sampling positions should typically not exceed $\pi/(2k_{max})$, where $k_{max}$ is the maximum value that the modulus of the vector $k_\mu$ assumed in Eq. [2].

Regular Cartesian grids are a good choice for discretisation. Nevertheless, the positions $r_\rho$ may form any sampling pattern, including hexagonal or radial patterns, patterns with variable density, as well as patterns that are restricted to irregularly shaped volumes.

3. SRF Norm and Spatial Weighting

In the described embodiment, SRF deviation is quantified by a vector norm in combination with a general linear mapping. In principle, any norm and any mapping may be used. A preferable choice is the Euclidean norm (or 2-norm), leading to the reconstruction formulae stated above.

The additional linear mapping A can be used to introduce spatial weighting, thus expressing spatially varying priority in SRF optimization. Two typical rationales for doing so are described in the following. The first one is to exploit prior knowledge about the expected signal distribution in the object. Such knowledge permits making $\Delta_\pi$ an estimate not just of SRF deviation but of the actual signal error incurred by SRF deviations. For instance, if the support of the object is known, A can be made diagonal, setting to zero the diagonal entries that correspond to positions outside the object, while the others are set to one (see J Tsao. IEEE Trans Med Imaging 2001; 20: 1178-1183.). In this fashion, one can express that the SRF does not matter where no MR signal is expected and thus leave more room for noise minimisation.

Often, more than just the support of the object is known. For instance, reference or scout images can provide an estimate of the resonance signal distribution inside the object. This knowledge can be exploited by setting the diagonals of A to the corresponding signal estimates. This would usually involve interpolating and potentially regridding the prior image to the grid chosen for spatial discretisation. The benefit is again a more accurate measure of signal error, thus providing specific additional room for noise minimization.

A yet more advanced option is setting $\theta = AA^H$ equal to the expected signal covariance in the object. In this fashion, the spatial signal correlation present in the object can be exploited as well. However, this option requires significant statistical knowledge about the signal covariance, which will often not be available.

As a second reason for spatial weighting, SRF shaping may require higher SRF fidelity in certain target regions while penalizing SRF deviations to a smaller degree in other regions, irrespective of prior knowledge about the specific signal distribution within the object. For this purpose, A should be set to a diagonal matrix of spatial weighting coefficients, which are high where high fidelity is desired.

For combining prior knowledge with additional weighting, $A^{prior}$ and $A^{add}$ can be chosen according to the previous considerations, respectively, yielding the net weighting $$A = A^{add} A^{prior} \qquad [17]$$

Finally, if neither variant of spatial weighting is desired, A should be set to an identity matrix.

Apart from Euclidean and weighted Euclidean norms, the concepts of SRF optimization and joint SRF and noise optimization, as described above, apply equally to any other norm. Non-Euclidean norms will generally enhance the computational demands significantly. However, they can also add useful features. The maximum (Chebyshev) norm, for instance, judges the quality of an actual SRF by its maximum deviation from the ideal. This leads to so-called equi-ripple deviations, where the modulus maxima have the same value along each row of the deviation matrix $SRF_{discrete} - T$.

4. Noise Covariance Matrix Ψ

In order to account accurately for noise propagation into the final image, the noise covariance matrix Ψ should typically be constructed according to the paper by K P Pruessmann et al. (Magn Reson Med 2001;46:638-651), based on experimental noise assessment as described therein. Alternatively, Ψ may be replaced by an identity matrix, thus pretending that noise in the input data is mutually uncorrelated and of equal strength throughout. As a result, the noise estimation will be less accurate, shifting the balance between noise and SRF deviation towards less favourable results. Another alternative is to ensure actually uncorrelated noise by decorrelating the input data in a first step, as described in the same paper (Magn Reson Med 2001;46:638-651). In that case, Ψ becomes an identity matrix and can be discarded without penalty.

5. Weighting Coefficients α,β

The weighting coefficients α and β, introduced in Eq. [14], express the relative importance of minimizing noise and SRF deviation, respectively. By changing their ratio, the balance between the two forms of error in the final image can be shifted. Practically, either factor can be held constant, while the ratio is adapted via the other. This remaining choice is subject to the individual imaging situation. Typically, the resulting noise and image artifact levels should be in the same order of magnitude. Preferable choices for $\alpha$ and $\beta$ are such that $\alpha\Psi$ and $\beta\theta$ approximate the actual noise covariance in the measured data and the actual resonance signal covariance in the object. One problem in making these choices is that the strength of the resonance signal is usually not known a priori. Therefore, the coefficient ratio is typically determined empirically or from a preliminary reconstruction with non-optimal $\alpha$ and $\beta$, which provides an estimate of the signal strength.

Another option is to adjust the coefficient ratio iteratively, based on the actual noise and artifact levels obtained in successive reconstructions. Note that for any given coefficients, both error measures can be obtained from Eqs. [10], [13], inserting F according to Eq. [15] or [16]. In particular, with iterative adjustment of $\alpha,\beta$ any desired ratio of $\Lambda_\pi$ and $\Delta_\pi$ can be obtained on a pixel by pixel basis. Alternatively, a certain range of coefficient ratios may be covered by a series of reconstructions, providing a choice of ratios between $\Lambda_\pi$ and $\Delta_\pi$ for each pixel. A final image can then be obtained by selecting the most suited instance for each pixel value. Generally, image quality changes smoothly as a function of $\alpha,\beta$, making the precise choice of these parameters relatively uncritical.

Further crucial choices independent of image reconstruction concern the encoding strategy. If gradient encoding is used, the pattern of sampled positions in k-space must be chosen. Typical choices include Cartesian, hexagonal, radial, or a spiral patterns. However, arbitrary k-space patterns, including random sampling, are equally consistent with the present invention.

If sensitivity encoding with one or multiple receiver coils is used, the choice and positioning of the coils is important. For RF encoding the choice of the encoding scheme is likewise essential. Any combination of these encoding mechanisms is consistent with the presented methods. Any further encoding mechanism, as long as essentially linear, can be accommodated by incorporating the encoding effect into the encoding functions introduced in Eq. [1].

Implementation

As stated in Eq. [3], the general reconstruction formula is given by:

$$p=Fm \quad [18]$$

In the described embodiment, the reconstruction matrix F is calculated according to Eq. [15], or [16]. These two cases, labeled A and B, are distinguished below:

A. If the number of rows of E is less than or equal to the number of columns of E, the first form of F (Eqs. [15]) is preferred as it poses the smaller inversion problem, leading to $$p=T\theta E^H(E\theta E^H+\Psi)^+m \quad [19]$$

where the weighting coefficients $\alpha,\beta$ have been incorporated in the matrices $\Psi$ and $\theta$, respectively. Using a root decomposition (e.g. the Cholesky decomposition) of $\Psi^{-1}$, $$\Psi^{-1}=L^HL, \quad [20]$$

Eq. [19] can be expanded and expressed equivalently as:

$$p=T\theta(LE)^H((LE)\theta(LE)^H+I)^+Lm \quad [21]$$

where I denotes the identity matrix. The image vector p can thus be calculated in 4 steps:
A1. c=Lm
A2. c'=((LE)$\theta$(LE)$^H$+I)$^+$c
A3. c"=$\theta$(LE)$^H$c'
A4. p=Tc"

The implementation of steps A1 to A4 is described below.

B. If the number of rows of E is larger than the number of columns of E, the second form of F (Eq. [16]) is preferred, leading to:

$$p=T(E^H\Psi^{-1}E+\theta^+)^+E^H\Psi^{-1}m \quad [22]$$

where, again, the weighting coefficients $\alpha$ and $\beta$ have been incorporated in the matrices $\Psi$ and $\theta$, respectively. Using L according to Eq. [20], this can likewise be expanded and expressed equivalently as:

$$p=T((LE)^H(LE)+\theta+)+(LE)^HLm \quad [23]$$

The image vector p can thus be calculated in 4 steps:
B1. c=Lm
B2. c'=(LE)$^H$c
B3. c"=((LE)$^H$(LE)+$\theta^+$)$^+$c'
B4 p=Tc"

The implementation of steps B1 to B4 is described below.

Steps A1 and B1 are implemented by multiplying the corresponding data by the noise decorrelation matrix L. This creates a new set of data, c, whose entries are characterized by mutually uncorrelated noise, while each having unit noise level. Typically, data acquired at different points in time have no or negligible noise correlation. However, data acquired simultaneously with multiple receiver coils often exhibit noise correlation. In this case, the application of the matrix L reduces to a linear recombination of the data from the different receiver channels (see K P Pruessmann et al., Magn Reson Med 2001;46:638-651). For the sake of simplicity these linearly combined channels will be referred to as noise-decorrelated channels in the following.

When the data are decorrelated with respect to noise, the same linear manipulation is performed on the encoding matrix. In the most typical case where noise correlation is only found among different receiver coils, this manipulation affects only the sensitivity-related factor in the encoding matrix. Multiplying the matrices L and E is then practically performed by creating linear recombinations of the coils' sensitivity maps. These new sensitivity maps correspond to virtual coils characterized by receiving mutually uncorrelated, unit noise. For the sake of simplicity these sensitivity maps will be referred to as decorrelated sensitivity maps hereafter.

Steps A2 and B3 involve solving an equation of the form x=A$^+$b. In case of step A2, x, A, and b represent c', ((LE)$\theta$(LE)$^H$+I), and c, respectively. In case of step B3, x, A and b represent c", ((LE)$^H$(LE)+$\theta^+$), and c'. Both steps can be solved in several ways. Here, two options are described. The first way is to explicitly determine the inverse A$^+$ and multiply it with b. The matrix inversion can be accomplished, for example, by factoring A using a singular value decomposition (SVD), and by inverting the decomposed factors. The second way is to restate the inversion problem as Ax=b and calculate a solution procedurally. This can be done using iterative algorithms such as the conjugate gradient (CG) method. The second way is the preferred embodiment, particularly for large matrix sizes, since it does not require explicit storage of the matrix A, but only requires the effect of pre-multiplication with A to be applied to intermediate vectors y. The latter can be done procedurally in an efficient manner by noting the following:

Performing the multiplication (LE)y is equivalent to replicating y by the number of receiver coils, multiplying each replicate with one of the decorrelated sensitivity maps, (sampled along $r_\rho$), performing gridding and fast Fourier transform (FFT) for each virtual channel and applying regridding to determine the data at each sampled position of k-space for each noise-decorrelated channel.

Performing the multiplication $(LE)^H y$ is equivalent to gridding k-space data for each channel, applying inverse FFT for each channel, multiplying each of the resulting images by the complex conjugate of the corresponding noise-decorrelated sensitivity map, regridding along $r_\rho$, and summing the results over the virtual channels. Further details of solving Ax=b procedurally can be found in the paper by K P Pruessmann et al. (Magn Reson Med 2001;46:638-651).

With the gridding operations, this implementation is applicable to non-Cartesian sampling patterns, and it additionally allows for variable density sampling, density weighting, and all types of k-space shutters.

Steps A3 and B2 involve multiplication with $(LE)^H$. This can be performed either explicitly or procedurally as described above for steps A2 and B3. Step A3 additionally involves multiplication with θ. If θ is a diagonal matrix, this can be performed efficiently as an element-wise multiplication.

Steps A4 and B4 involve multiplication with T. If the target voxels all have the same shapes and differ only by a spatial shift, this multiplication amounts to a convolution. Then, steps A4 and B4 can be implemented efficiently by Fourier transforming c" to k-space with FFT, multiplying the transformed data by the k-space representation of the target voxel shape centered in the field of view, and inverse Fourier transforming the result back to geometric space. If the target voxels are not arranged along a Cartesian grid or the spatial discretisation is not Cartesian, the two Fourier operations require additional gridding.

In all situations where gridding is mentioned, the usual considerations for oversampling, and post-gridding apodization correction.

PRACTICAL EXAMPLES OF THE INVENTION

Figure 1:
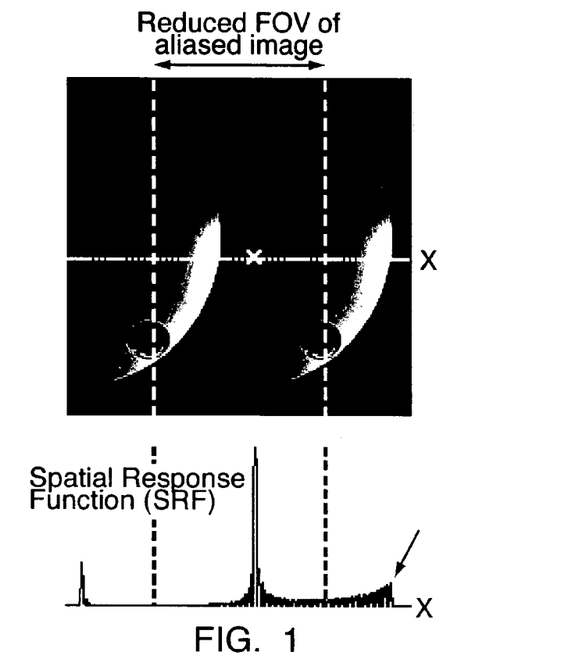
Figure 2:
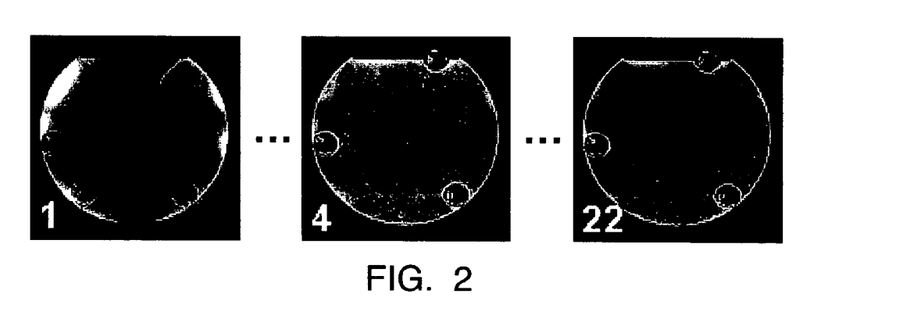

Images (256×256, 220 mm FOV, 3 mm thickness) were acquired from a phantom in a Philips Intera 1.5T scanner (Philips Medical Systems B.V., Best, Netherlands) using a gradient echo sequence and five surface coils placed around the phantom. Reconstruction was performed iteratively using the conjugate gradient algorithm (see FIG. 2), due to its efficiency and its ability to handle non-Cartesian sampling as well. Equation [3] is generally ill-conditioned, due to non-orthogonality of the encoding functions. In the present method the ill-conditioning has been overcome with Tikhonov regularization, i.e. by choosing θ as an identity matrix.

Figure 3A:
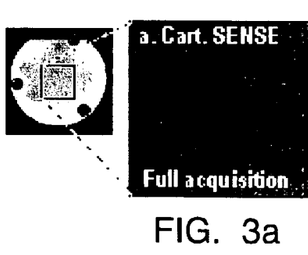
Figure 3B:
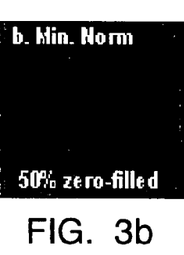
Figure 3C:
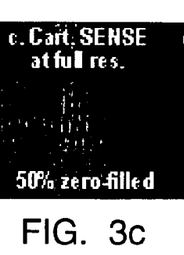
Figure 3D:
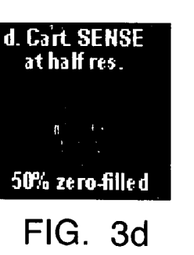

When the full k-space has been acquired, aliasing is eliminated by Cartesian SENSE reconstruction (see FIG. 3a). However, aliasing artifacts remain noticeable, if k-space is 50% zero-filled (see FIG. 3c). The artifacts are not eliminated by applying Cartesian SENSE at a lower resolution without zero-filling first (see FIG. 3d), but they are eliminated completely with the reconstruction described in this invention, which will be referred to as the minimum-norm reconstruction (see FIG. 3b).

Figure 4:
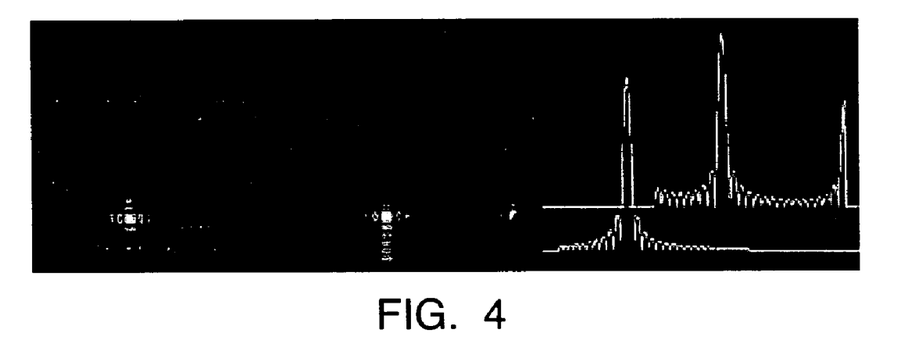
Figure 5:
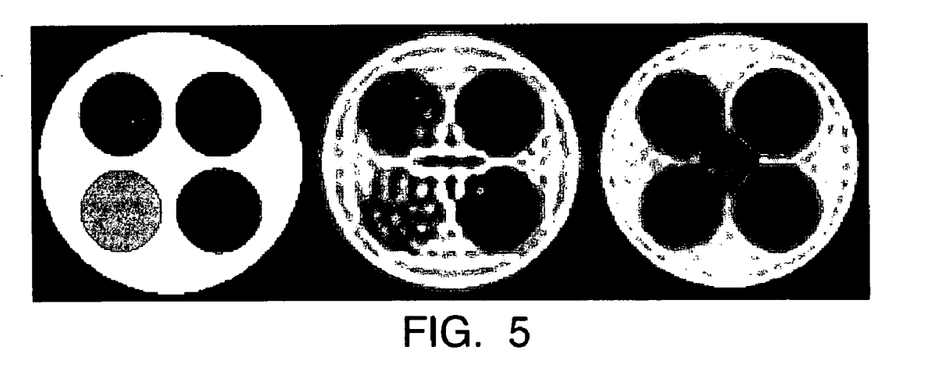

FIG. 4 shows sample SRFs as obtained with minimum norm (a,c) and conventional (b,d) reconstruction. With the latter, the subject pixel in the lower left part of the phantom suffers significant contamination from an aliasing lobe just outside the object. This contamination is largely eliminated with the minimum norm approach. Contamination from the pixel's close neighbourhood is also considerably reduced, as evident from the line plots on the right. These plots also reveal that the SRF sidelobe spacing is reduced and the main lobe is minutely narrowed, corresponding to slight resolution improvement. These effects reflect that minimum norm reconstruction not only accounts for sensitivity gradients, but actually exploits them for favourable SRF shaping. FIG. 5 shows unfiltered reconstructed images along with the phantom used. With the conventional method, marked artifacts occur in the center, which stem from contamination from the object border. These and minor further artifacts are largely eliminated with minimum norm reconstruction. Note the visible resolution enhancement near the object border where coil sensitivity gradients are the steepest.

Figure 6:
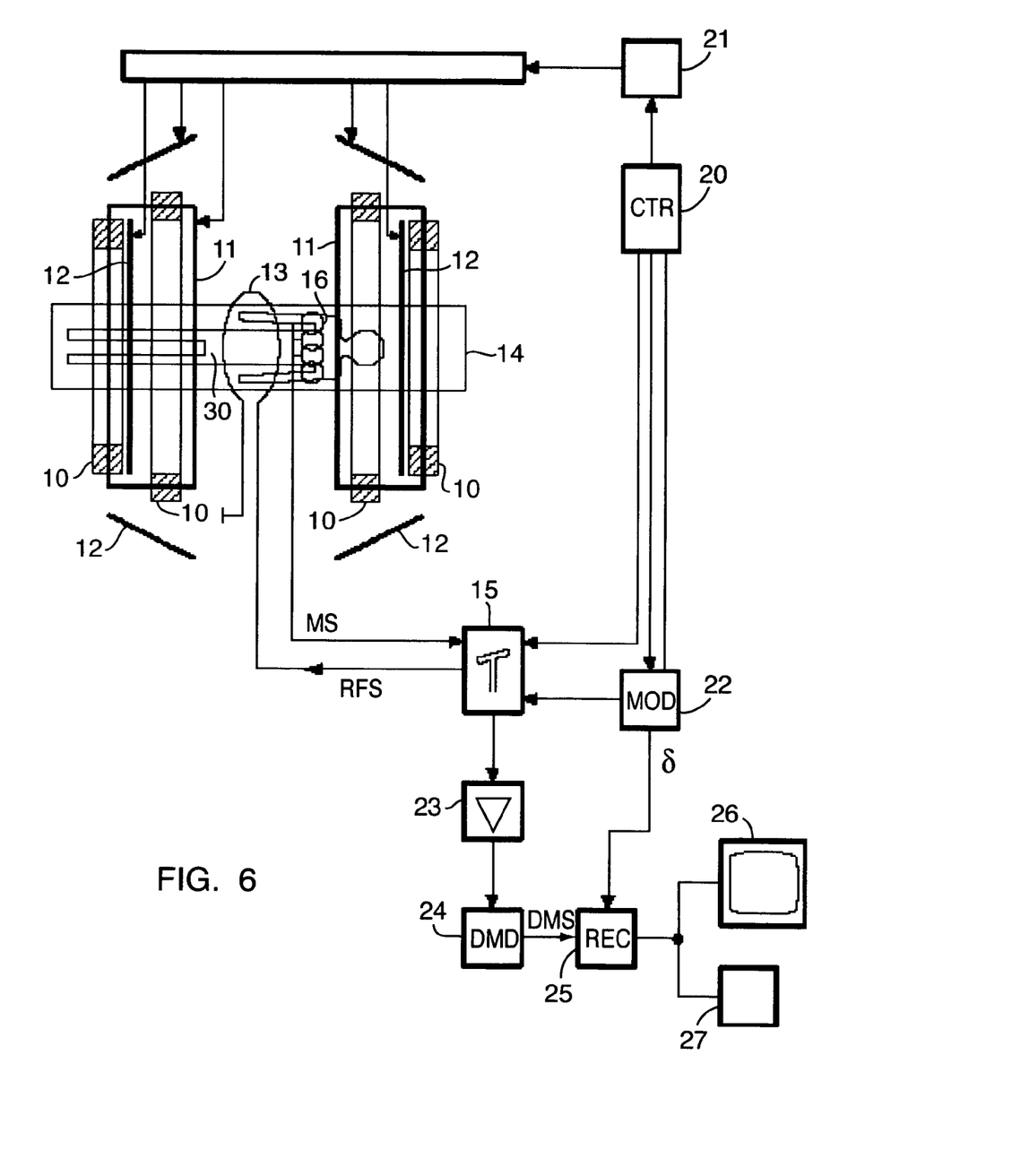

FIG. 6 shows diagrammatically a magnetic resonance imaging system in which the invention is used.

The magnetic resonance imaging system includes a set of main coils 10 whereby a steady, uniform magnetic field is generated. The main coils are constructed, for example in such a manner that they enclose a tunnel-shaped examination space. The patient to be examined is slid on a table into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. The gradient coils 11, 12 are energized by application of an electric current by means of the power supply unit 21. The strength, direction and duration of the gradients are controlled by control of the power supply unit. The magnetic resonance imaging system also includes transmission and receiving coils 13, 15 for generating RF excitation pulses and for picking up the magnetic resonance signals, respectively. The transmission coil 13 is preferably constructed as a body coil whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of the RF excitation pulses and RF refocusing pulses. Preferably, the body coil 13 involves a spatially uniform intensity distribution of the transmitted RF pulses. The receiving coils 15 are preferably surface coils 15 which are arranged on or near the body of the patient 30 to be examined. Such surface coils 15 have a high sensitivity for the reception of magnetic resonance signals which is also spatially inhomogeneous. This means that individual surface coils 15 are mainly sensitive for magnetic resonance signals originating from separate directions, i.e. from separate parts in space of the body of the patient to be examined. The coil sensitivity profile represents the spatial sensitivity of the set of surface coils. The transmission coils, notably surface coils, are connected to a demodulator 24 and the received magnetic resonance signals (MS) are demodulated by means of the demodulator 24. The demodulated magnetic resonance signals (DMS) are applied to a reconstruction unit. The reconstruction unit reconstructs the magnetic resonance image from the demodulated magnetic resonance signals (DMS) and on the basis of the coil sensitivity profile of the set of surface coils. The coil sensitivity profile has been measured in advance and is stored, for example electronically, in a memory unit which is included in the reconstruction unit. The reconstruction unit derives one or more image signals from the demodulated magnetic resonance signals (DMS), which image signals represent one or more, possibly successive magnetic resonance images. This means that the signal levels of the image signal of such a magnetic resonance image represent the brightness values of the relevant magnetic resonance image. The reconstruction unit 25 in practice is preferably constructed as a digital image processing unit 25 which is programmed so as to reconstruct the magnetic resonance image from the demodulated magnetic resonance signals and on the basis of the coil sensitivity profile. The digital image processing unit 25 is notably programmed so as to execute the reconstruction in conformity with the present invention. The image signal from the reconstruction unit is applied to a monitor 26 so that the monitor can display the image information of the magnetic resonance image (images). It is also possible to store the image signal in a buffer unit 27 while awaiting further processing, for example printing in the form of a hard copy.

In order to form a magnetic resonance image or a series of successive magnetic resonance images of the patient to be examined, the body of the patient is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the gradient fields. For example, the gradient coils 12 apply a selection gradient in order to select a more or less thin slice of the body. Subsequently, the transmission coils apply the RF excitation pulse to the examination space in which the part to be imaged of the patient is situated. The RF excitation pulse excites the spins in the selected slice, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which is much larger man such a thin slice; for example, the spins can be excited in a three-dimensional part which extends substantially in three directions in the body. After the RF excitation, the spins slowly return to their initial state and the macroscopic magnetization returns to its (thermal) state of equilibrium. The relaxing spins then emit magnetic resonance signals. Because of the application of a read-out gradient and a phase encoding gradient, the magnetic resonance signals have a plurality of frequency components which encode the spatial positions in, for example the selected slice. The k-space is scanned by the magnetic resonance signals by application of the read-out gradients and the phase encoding gradients. According to the invention, the application of notably the phase encoding gradients results in the sub-sampling of the k-space, relative to a predetermined spatial resolution of the magnetic resonance image. For example, a number of lines which is too small for the predetermined resolution of the magnetic resonance image, for example only half the number of lines, is scanned in the k-space.

The invention claimed is:

1. A magnetic resonance imaging method for producing one or more magnetic resonance images of a region of a subject, comprising the steps of:
    applying a uniform magnetic field to the subject,
    applying a gradient field to the subject,
    acquiring spatially encoded magnetic resonance signals from one or more receiver antennae, and
    reconstructing the image from the spatially encoded magnetic resonance signals, said reconstructing including optimizing a spatial response function (SRF) individually for each pixel in the image, wherein the SRF is defined by the spatial signal response from the subject to be imaged.

2. A magnetic resonance imaging method according to claim 1, wherein the spatial encoded magnetic resonance signals are acquired in an undersampled fashion.

3. A magnetic resonance imaging method according to claim 1, wherein the spatial response function is optimized individually for each pixel by minimizing a cost function, which determines the deviation of the spatial response function from a target spatial response function specified individually for each pixel.

4. A magnetic resonance imaging method according to claim 3, wherein the cost function is determined by a norm of the deviation of the spatial response function after an optional linear mapping, wherein the specific choices of linear mapping and norm can be chosen individually for each pixel.

5. A magnetic resonance imaging method according to claim 4, wherein the norm is a p-norm.

6. A magnetic resonance imaging method according claim 4, wherein an iterative algorithm is applied for optimization of the cost function.

7. A magnetic resonance imaging method according to claim 3, wherein the shape of the spatial response function is optimized jointly with a noise level in a final image, and wherein the cost function for each pixel is modified to additionally include a noise statistic for each pixel.

8. A magnetic resonance imaging method according to claim 7, wherein the cost function is a sum or a sum of squares of one term measuring the spatial response function deviation, and one term measuring noise statistics.

9. A magnetic resonance imaging method according to claim 7, wherein an estimate of the noise level is based on the noise covariance of the input data.

10. A magnetic resonance imaging method according to claim 1, wherein the spatial response functions are discretized with a sufficiently high resolution to capture all significant features of target and actual SRFs, the latter of which is determined by the resolution of the acquired data.

11. A magnetic resonance imaging method according to claim 1, wherein the optimization of the spatial response function is weighted within the object to be imaged.

12. A magnetic resonance imaging method according to claim 1, wherein optimizing the spatial response function includes arranging a plurality of target response functions that have a distinctive peak at their respective voxel centers and are arranged in any pattern.

13. A magnetic resonance imaging method according to claim 1 wherein a linear transform or norm is used in measuring a deviation of the spatial response function is based on an estimate of one of the signal distribution, a covariance in the object, a covariance in a reference image data, an anatomical side information, and a physiological side information.

14. A magnetic resonance imaging system for providing a magnetic resonance image of a region of a subject comprising:
- a static main magnet having a main magnetic field,
- means for applying a read gradient and other gradient fields,
- at least one receiver antenna,
- means for measuring MR signals along a predetermined trajectory containing a plurality of lines in k-space, and
- means for reconstructing the image from the spatially encoded magnetic resonance signals, which reconstruction results from optimizing the spatial response function (SRF) individually for each pixel in the image, wherein the SRF is defined by the spatial signal response from the region of the subject to be imaged.

15. A magnetic resonance imaging system according to claim 14, wherein
- said means for reconstructing the image include means for optimization of a cost function, which determines the deviation of the spatial response function from a target response function specified individually for each pixel of the image and/or a noise statistic corresponding thereto.

16. A computer application stored on a computer-readable medium for producing successive magnetic resonance images of a region of a subject, the computer application comprising executable instructions to:
- apply a uniform magnetic field to the subject,
- apply a read gradient and other gradient fields to the subject, acquiring spatially encoded magnetic resonance signals by one or more receiver antennae, and
- reconstructing an image from the spatially encoded magnetic resonance signals, which reconstruction results from optimizing a spatial response function (SRF) individually for each pixel in the image, wherein the SRF is defined by the spatial signal response from the region of subject to be imaged.

17. A computer application according to claim 16, wherein the spatial response functions are optimized by means of a cost function which determines the deviation of the spatial response function from a target spatial response function specified individually for each pixel of an image and/or a noise statistic corresponding thereto.

18. A computer application according to claim 16, wherein the magnetic resonance signals are acquired in an undersampled fashion.

* * * * *